(12) United States Patent
Misumi et al.

(10) Patent No.: US 8,236,614 B2
(45) Date of Patent: Aug. 7, 2012

(54) SEMICONDUCTOR DEVICE MANUFACTURING METHOD

(75) Inventors: Sadahito Misumi, Osaka (JP); Takeshi Matsumura, Osaka (JP)

(73) Assignee: Nitto Denko Corporation, Osaka (JP)

( * ) Notice: Subject to any disclaimer, the term of this patent is extended or adjusted under 35 U.S.C. 154(b) by 266 days.

(21) Appl. No.: 11/816,696

(22) PCT Filed: Feb. 20, 2006

(86) PCT No.: PCT/JP2006/302948
§ 371 (c)(1),
(2), (4) Date: Aug. 20, 2007

(87) PCT Pub. No.: WO2006/088180
PCT Pub. Date: Aug. 24, 2006

(65) Prior Publication Data
US 2009/0032976 A1    Feb. 5, 2009

(30) Foreign Application Priority Data
Feb. 21, 2005    (JP) .................................. 2005-044042

(51) Int. Cl.
*H01L 21/00*    (2006.01)
(52) U.S. Cl. .......... 438/118; 156/60; 156/329; 156/330; 156/326; 156/327
(58) Field of Classification Search .................. None
See application file for complete search history.

(56) References Cited

U.S. PATENT DOCUMENTS

| | | | |
|---|---|---|---|
| 5,622,588 A | 4/1997 | Weber | |
| 5,798,014 A | 8/1998 | Weber | |
| 6,214,640 B1 | 4/2001 | Fosberry et al. | |
| 6,224,936 B1 | 5/2001 | Gochnour et al. | |
| 6,265,782 B1 * | 7/2001 | Yamamoto et al. | .......... 257/783 |

(Continued)

FOREIGN PATENT DOCUMENTS

EP    386909 A2 *    9/1990

(Continued)

OTHER PUBLICATIONS

Wolf et al. (Silicon Processing for the VLSI Era, vol. 1: Process Technology. 2nd Ed. Sunset Beach: Lattice Press, 2000. 853, Fig. 17-7).*

(Continued)

*Primary Examiner* — Ha Tran T Nguyen
*Assistant Examiner* — Shantanu C Pathak
(74) *Attorney, Agent, or Firm* — Knobbe Martens Olson & Bear LLP

(57) ABSTRACT

Provided are a semiconductor device producing method with simple production steps while preventing contamination of a bonding pad and preventing warp generation in an adherend such as a substrate, a lead frame, or a semiconductor element, thereby improving yield; an adhesive sheet used in this method; and a semiconductor device obtained by this method. The invention includes a pre-setting step of pre-setting a semiconductor element 13 to an adherend 11 through an adhesive sheet 12, and a wire bonding step of wire bonding the element 13 in the bonding temperatures range of 80 to 250° C. without performing any heating step, wherein, as the adhesive sheet 12, a sheet having a storage elastic modulus of 1 MPa or more in the temperature range of 80 to 250° C. or a storage elastic modulus of 1 MPa or more at any temperature in the temperature range before curing the sheet 12 is used.

14 Claims, 7 Drawing Sheets

U.S. PATENT DOCUMENTS

| | | | |
|---|---|---|---|
| 6,352,879 B1 * | 3/2002 | Fukui et al. | 438/106 |
| 6,652,688 B2 * | 11/2003 | Matsumura et al. | 156/64 |
| 7,232,709 B2 * | 6/2007 | Misumi et al. | 438/118 |
| 7,772,040 B2 | 8/2010 | Misumi et al. | |
| 2001/0022404 A1 | 9/2001 | Yamamoto et al. | |
| 2003/0102573 A1 | 6/2003 | Tanabe et al. | |
| 2005/0156321 A1 * | 7/2005 | Misumi et al. | 257/777 |
| 2005/0227384 A1 * | 10/2005 | Nagano et al. | 438/15 |
| 2006/0243947 A1 | 11/2006 | Tsumura et al. | |
| 2007/0098995 A1 | 5/2007 | Masuko et al. | |
| 2007/0205249 A1 | 9/2007 | Marsh et al. | |
| 2008/0064141 A1 | 3/2008 | Misumi et al. | |

FOREIGN PATENT DOCUMENTS

| | | |
|---|---|---|
| EP | 0 959 498 A1 | 11/1999 |
| JP | 55-111151 A | 8/1980 |
| JP | 5-095010 A | 4/1993 |
| JP | 10-292163 | 11/1998 |
| JP | 10-335534 | 12/1998 |
| JP | 2000-104040 A | 4/2000 |
| JP | 2001-223300 | 8/2001 |
| JP | 2001-313301 | 11/2001 |
| JP | 2002-105428 | 4/2002 |
| JP | 2002-118144 | 4/2002 |
| JP | 2002-134531 | 5/2002 |
| JP | 2002-179769 A | 6/2002 |
| JP | 2002-261233 A | 9/2002 |
| JP | 2003-264205 | 9/2003 |
| JP | 2003-297861 | 10/2003 |
| JP | 2005-19516 A | 1/2005 |
| JP | 2005019516 A * | 1/2005 |
| JP | 2005-183703 | 7/2005 |
| JP | 2008-205195 | 9/2008 |
| KR | 2000-0048963 | 7/2000 |
| KR | 2003-0014108 | 2/2003 |
| KR | 2004-0016855 | 2/2004 |
| TW | 288185 | 10/1996 |
| TW | 200502372 | 1/2005 |
| WO | WO 98/15975 | 4/1998 |
| WO | WO 02/089553 | 11/2002 |
| WO | WO 2004030075 A1 * | 4/2004 |

OTHER PUBLICATIONS

Semiconductor OneSource Semiconductor Glossary: Wire Bonding.*

International Search Report issued on the corresponding PCT Application No. PCT/JP2006/302948, dated May 23, 2006.

http://en.wikipedia.org/wiki/Acrylic; http://en.wikipedia.orq/wiki/Acryl_group.

File History of the related U.S. Appl. No. 11/853,743, as of Aug. 28, 2009.

File History of the related U.S. Appl. No. 12/492,641, as of Aug. 28, 2009.

Korean Office Action issued on the corresponding Korean Patent Application No. 10-2007-7021581, dated Apr. 28, 2010.

File History of the related U.S. Appl. No. 11/853,743, for the period of Mar. 10, 2010-Oct. 8, 2010.

File History of the related U.S. Appl. No. 12/829,707, as of Oct. 8, 2010.

File History of the related U.S. Appl. No. 12/492,641, for the period of Mar. 10, 2010-Oct. 8, 2010.

File History of the related U.S. Appl. No. 12/829,707 for the period of Oct. 8, 2010-Mar. 9, 2011.

File History of the related U.S. Appl. No. 12/492,641 for the period of Oct. 8, 2010-Mar. 9, 2011.

Japanese Office Action issued by the Japanese Patent Office dated Apr. 15, 2011 for the counterpart Japanese Application No. 2006-039139.

Preliminary Notice of First Office Action issued by Taiwan Intellectual Property Office on Oct. 26, 2011 in the corresponding Taiwanese patent application No. 095105603.

File History of the related U.S. Appl. No. 11/853,743, for the period of Aug. 29, 2009-Mar. 9, 2010.

File History of the related U.S. Appl. No. 12/492,641, for the period of Aug. 29, 2009-Mar. 9, 2010.

* cited by examiner

[FIG. 1]
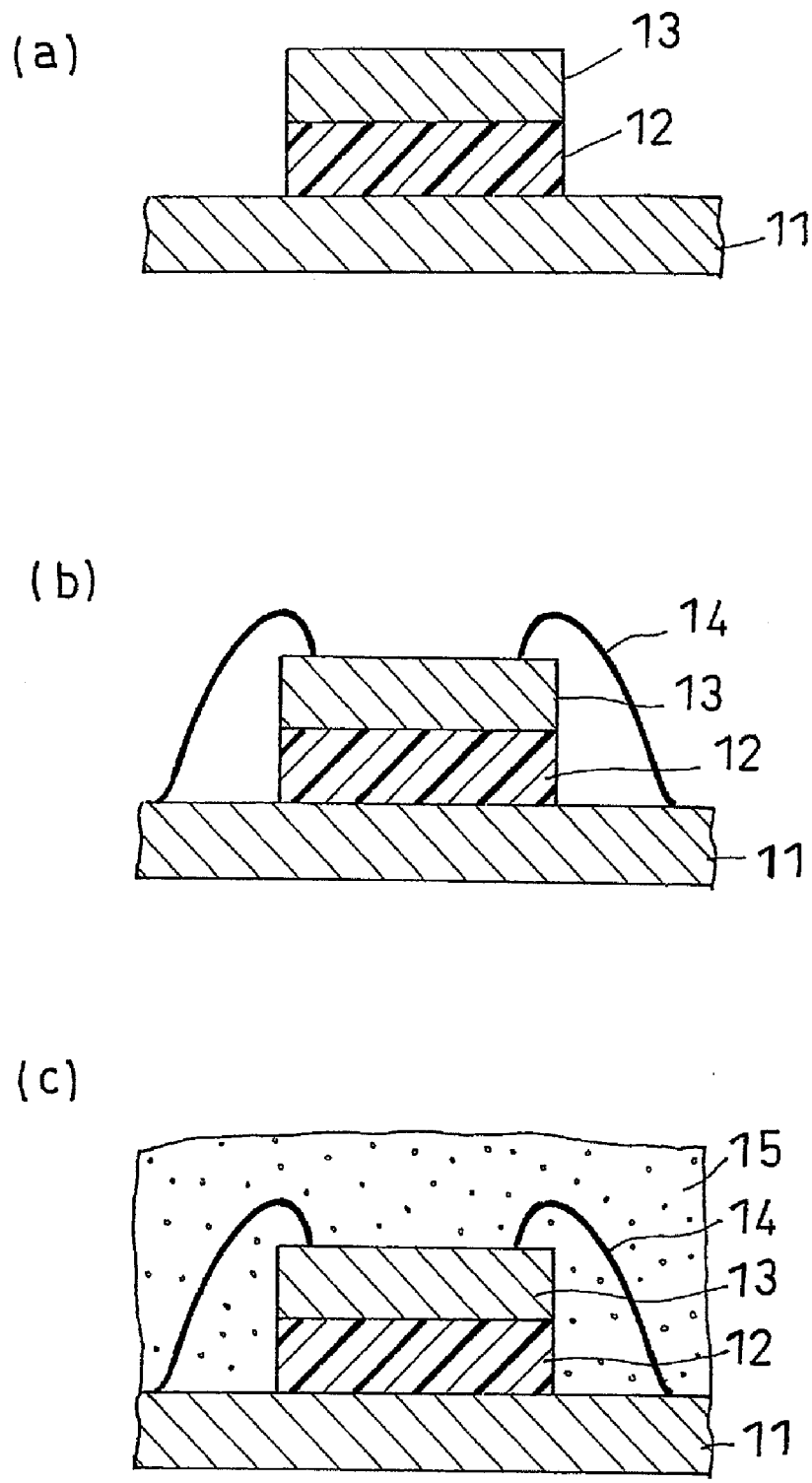

[FIG.2]
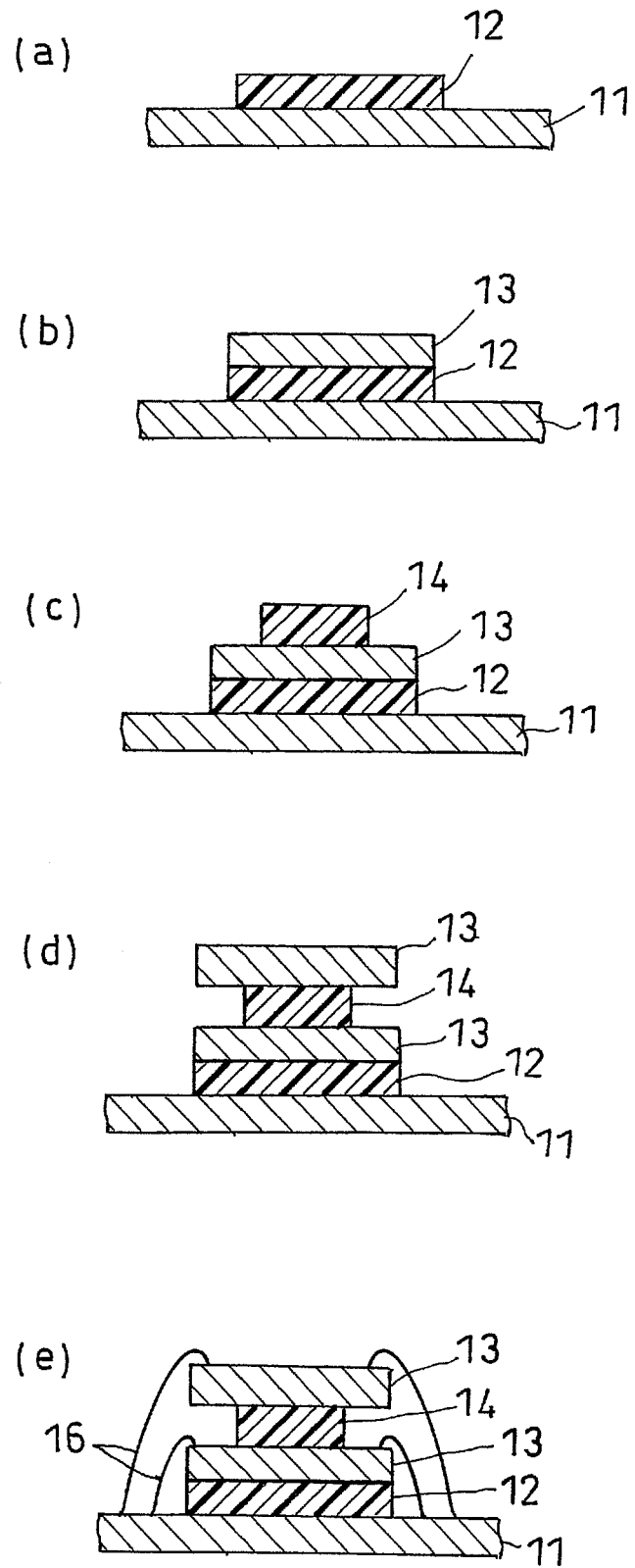

[FIG.3]
(a) 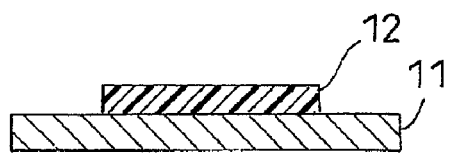
(b) 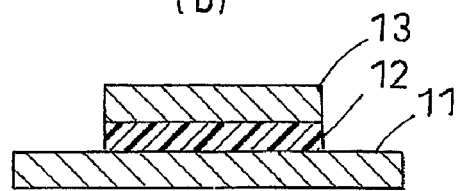
(c) 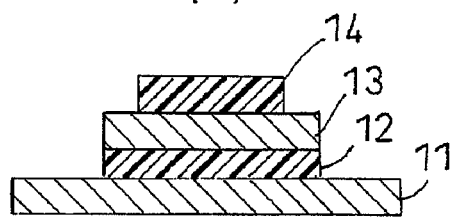
(d) 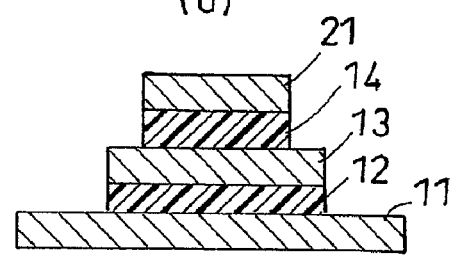
(e) 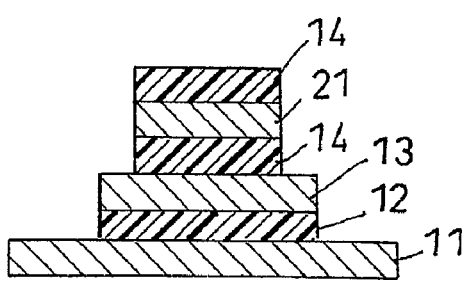
(f) 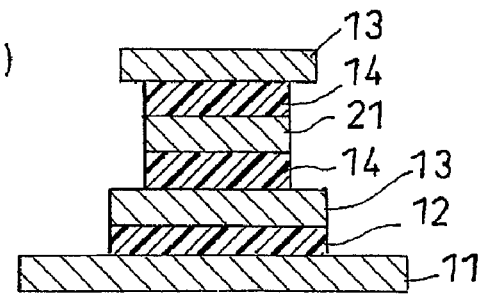
(g) 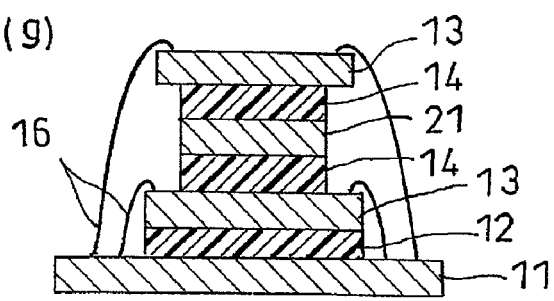

[FIG.4]
(a) 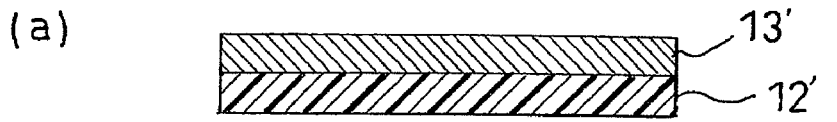
(b) 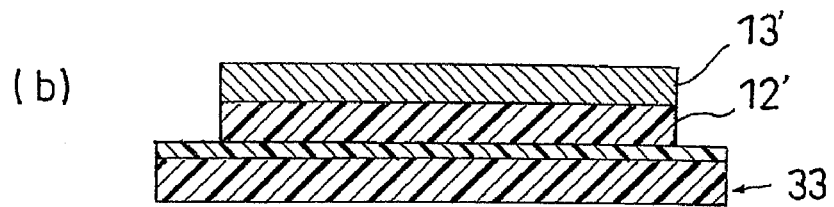
(c) 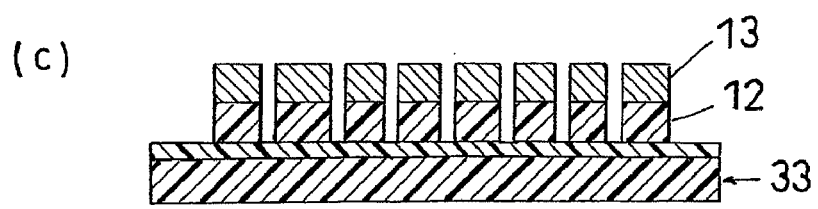
(d) 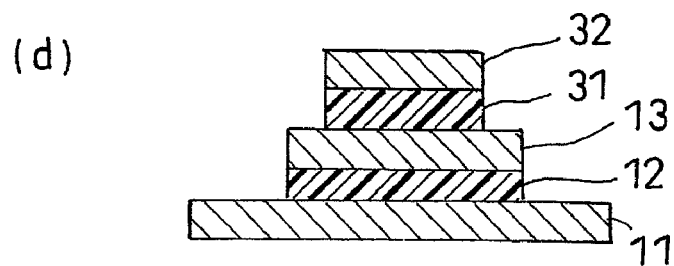
(e) 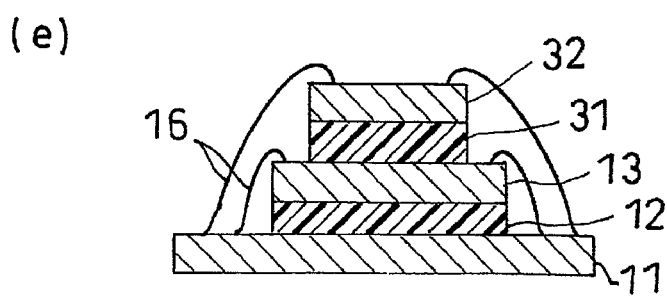

[FIG.5]
(a)
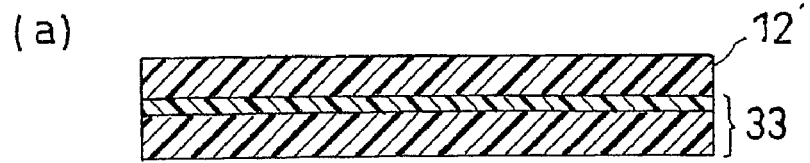
(b)
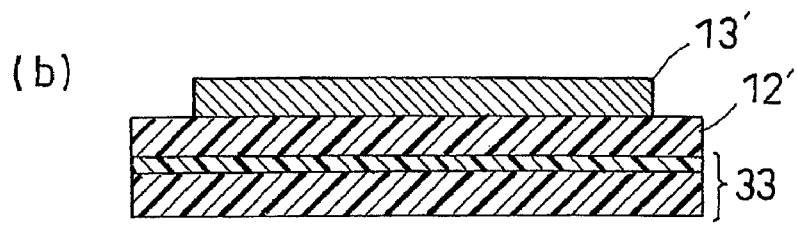
(c)
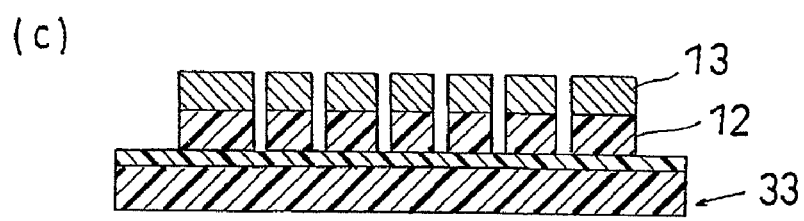
(d)
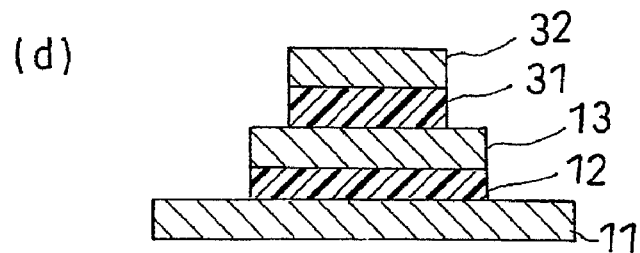
(e)
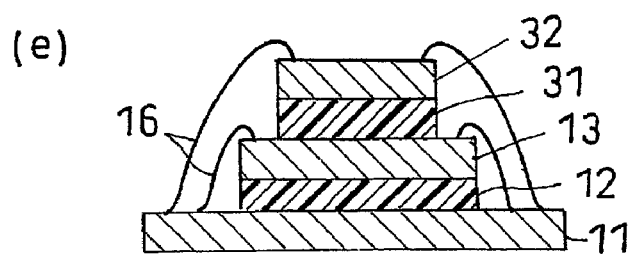

[FIG. 6]
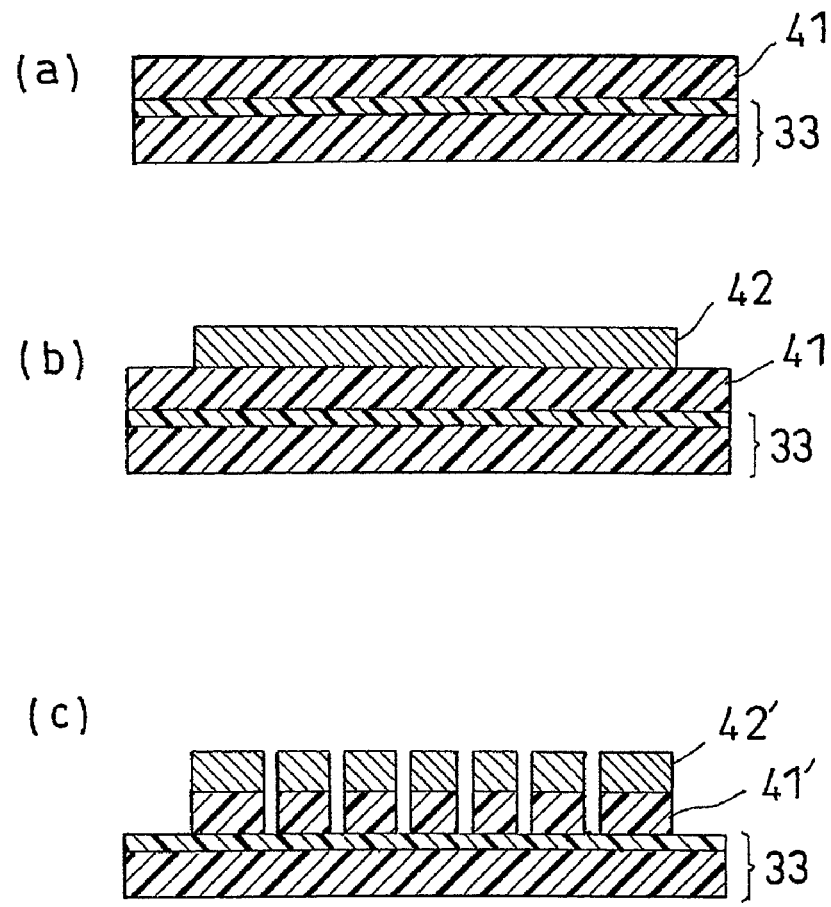
[FIG. 7]
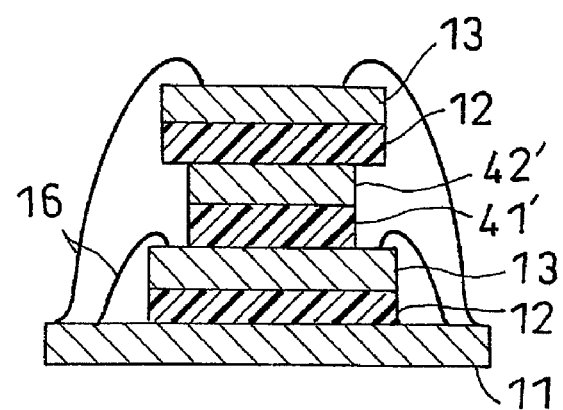

[FIG.8]
(a) 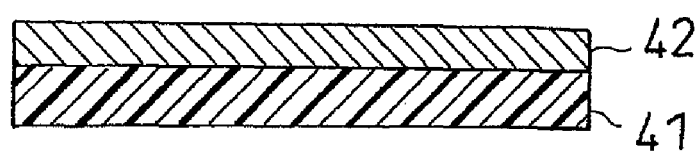
(b) 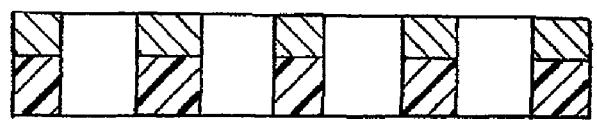
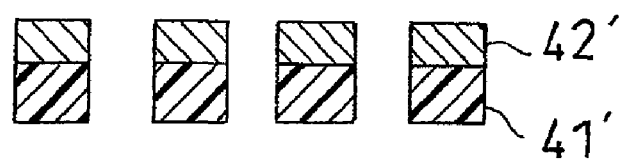

SEMICONDUCTOR DEVICE MANUFACTURING METHOD

This application is the U.S. National Phase under 35 U.S.C. §371 of International Application No. PCT/JP2006/302948, filed Feb. 20, 2006, which claims priority to the Japanese Patent Application No. 2005-044042, filed Feb. 21, 2005. The International Application was not published in English under PCT Article 21(2).

TECHNICAL FIELD

The present invention relates to a process for producing a semiconductor device, an adhesive sheet used in the process, and a semiconductor device obtained by the process.

BACKGROUND ART

In order to meet the request that semiconductor devices are made finer and caused to have higher functions, the wiring width of power supply lines arranged in the entire area of the main faces of their semiconductor chips (semiconductor elements) or the interval between signal lines arranged therein has been becoming narrower. For this reason, the impedance thereof increases or signals between signal lines of different nodes interfere with each other so as to cause hindrance to the exhibition of sufficient performances for the operation speed of the semiconductor chips, the margin of the operating voltage thereof, the resistance thereof against damage by electrostatic discharge, and others. In order to solve these problems, for example, in JP-A-55-111151 and JP-A-2002-261233, package structures wherein semiconductor elements are laminated are suggested.

As a material used to stick semiconductor elements to a substrate or the like, the following examples are suggested: an example wherein a thermosetting paste resin is used (see, for example, JP-A-2002-179769); and examples wherein an adhesive sheet composed of a thermoplastic resin and a thermosetting resin is used (see, for example, JP-A-2000-104040 and JP-A-2002-261233).

In conventional processes for producing a semiconductor device, an adhesive sheet or an adhesive is used to adhere semiconductor elements onto a substrate, a lead frame or semiconductor elements. The adhesion is performed by attaching the semiconductor elements to the substrate or the like under pressure (die attaching) and then curing the adhesive sheet or the like in a heating step. In this production method, wire bonding is performed in order to electrically bond the semiconductor element and the substrate each other, and then the semiconductor element is molded with a sealing resin and post-cured to seal the element with the sealing resin.

However, when the wire bonding is performed, the semiconductor elements on the substrate or the like are shifted by ultrasonic vibration or heating. Conventionally, therefore, it is necessary to perform a heating step before the wire bonding so as to heat and cure the thermosetting paste resin or thermosetting adhesive sheet, thereby sticking/fixing the semiconductor elements so as not to be shifted.

An adhesive sheet made of a thermoplastic resin or an adhesive sheet composed of a thermosetting resin and a thermoplastic resin is required to undergo a heating step after die attaching and before wire bonding in order to ensure adhesive force thereof onto an object which is to be stuck with the sheet, or improve the wettability thereof onto the object.

However, there is caused a problem that volatile gas is generated from the adhesive sheet or the like by the heating thereof which is performed before wire bonding. The volatile gas contaminates bonding pads. Thus, no wire bonding will be able to be carried out in many cases.

By heating and curing the adhesive sheet or the like, curing, shrinking or the like is caused in the adhesive sheet or the like. With this, stress is generated so as to result in a problem that a warpage is generated in the lead frame or the substrate stuck on the sheet (as well as the semiconductor elements). Additionally, a problem that a crack is generated in the semiconductor elements on the basis of the stress is caused in a wire bonding step. In recent years, the thickness of semiconductor elements has been made smaller from a conventional thickness of about 200 µm to a smaller value, in particular, to a thickness of 100 µm or less as the semiconductor elements have been made thinner and smaller. Considering this situation, the problems about the warpage of the substrate or the like or the crack in the semiconductor elements are more serious. Thus, it is increasingly becoming important to solve the problems.

Patent Document 1: Japanese Unexamined Patent Publication S55-111151
Patent Document 2: Japanese Unexamined Patent Publication 2002-261233
Patent Document 3: Japanese Unexamined Patent Publication 2002-179769
Patent Document 4: Japanese Unexamined Patent Publication 2000-104040

DISCLOSURE OF THE INVENTION

Problem to be Solved by the Invention

The present invention has been made, considering the above-mentioned problems, and an object thereof is to provide a process for producing a semiconductor device making production steps therein simple while preventing a matter that wire bonding cannot be attained due to contamination of a bonding pad and preventing the generation of a warp in an adherend such as a substrate, a lead frame, or a semiconductor element, thereby improving the yield; an adhesive sheet used in this method; and a semiconductor device obtained by this method.

Means for Solving Problem

In order to solve the above-mentioned problems, the present inventors have made eager investigations on a process for producing semiconductor device, adhesive sheets used in the process, and semiconductor devices obtained by the process. As a result, the inventors find out that the above-mentioned object can be attained by adopting a configuration that will be described below, to complete the invention.

Accordingly, the process for producing a semiconductor device according to the present invention includes a pre-setting step of pre-setting a semiconductor element through an adhesive sheet to an object to which the semiconductor element is to be set, and a wire bonding step of wire bonding the semiconductor element in the bonding temperature range of 80 to 250° C. without performing any heating step, in which as the adhesive sheet, a sheet having a storage elastic modulus of 1 MPa or more in the temperature range of 80 to 250° C. or a storage elastic modulus of 1 MPa or more at any temperature in the temperature range before curing the sheet is used.

In the above-mentioned process, the sheet, which has a storage elastic modulus of 1 MPa or more in the temperature range of 80 to 250° C. or a storage elastic modulus of 1 MPa or more at any temperature in the temperature range before curing the sheet, is used; therefore, even when the step of heating the adhesive sheet is omitted and the present process is transited to the wire bonding step in the state that the semiconductor element is set to the adherend, no shear deformation is generated in the adhesion face between the adhesive sheet and the adherend by ultrasonic vibration or heating in the step. Thus, in the wire bonding step, the success ratio of the wire bonding can be improved.

In conventional production method, an adhesive sheet is heated before their wire bonding step. By the heating, a volatile gas is generated from the adhesive sheet so that the bonding pad used may be contaminated. In the present invention, however, such heating is made unnecessary to make it possible to prevent the contamination of the used bonding pad due to the generation of a volatile gas from the adhesive sheet. Furthermore, the omission of the step of heating the adhesive sheet neither causes the substrate or the like to be warped nor the semiconductor element to be cracked. As a result, the semiconductor element can be made even thinner.

The adherend is preferably a substrate, a lead frame or a semiconductor element.

It is preferred that the process further includes a sealing step of sealing the semiconductor element with a sealing resin, and a post-curing step of subjecting the sealing resin to post-curing, wherein in the sealing step and/or the post-curing step, the sealing resin is cured by heating, and further the semiconductor element and the adherend are fixed each other through the adhesive sheet. This makes it possible to attain the fixing between the semiconductor element and the adherend through the adhesive sheet at the same time when the sealing resin is cured. As a result, the production method can be made simple.

It is preferred to use, as the adhesive sheet, a sheet including a thermoplastic resin.

It is preferred to use, as the adhesive sheet, a sheet including both of a thermosetting resin and a thermoplastic resin.

It is preferred to use, as the thermoplastic resin, an acrylic resin. It is also preferred to use, as the thermosetting resin, an epoxy resin and/or a phenol resin. These resins contain only a small amount of ionic impurities, and have a high heat resistance. Thus, the reliability of the semiconductor element can be certainly kept.

Moreover, the adhesive sheet according to the present invention is an adhesive sheet which is used in the production of a semiconductor device in order to solve the above-mentioned problems, and which has a storage elastic modulus of 1 MPa or more in the temperature range of 80 to 250° C. or a storage elastic modulus of 1 MPa or more at any temperature in the temperature range before curing the sheet.

The adhesive sheet preferably includes a thermoplastic resin.

The adhesive sheet preferably includes both of a thermosetting resin and a thermoplastic resin.

The thermoplastic resin is preferably an acrylic resin.

The thermosetting resin is preferably an epoxy resin and/or a phenol resin.

It is preferred that a crosslinking agent is added to the adhesive sheet.

In order to solve the above-mentioned problems, the semiconductor device according to the present invention is a semiconductor device obtained by the above-mentioned process for producing semiconductor device.

Effects for the Invention

The invention produces the following advantageous effects by the above-mentioned process, sheet and device.

According to the invention, a sheet having a storage elastic modulus of 1 MPa or more in the temperature range of 80 to 250° C. or at any temperature in the temperature range before curing the sheet is used; therefore, even when the step of heating the adhesive sheet is omitted and the present process is transited to a wire bonding step, the generation of shear deformation is prevented in the adhesion face between the adhesive sheet and an adherend. Thus, the wire bonding step is successively performed. Since the heating step can be omitted, the generation of a volatile gas from the adhesive sheet is also restrained. It is therefore possible to prevent the bonding pad used from being contaminated. Thus, the present invention makes it possible to improve the productivity of semiconductor devices, and improve the yield thereof.

The same effects and advantages as described above are produced in the case of laminating, over the above-mentioned semiconductor element, one or more semiconductor elements so as to interpose the same adhesive sheet(s) as described above between the semiconductor elements, or in the case of inserting a spacer between the above-mentioned semiconductor element and a semiconductor element as the above-mentioned object in such a manner that the adhesive sheet is interposed between each of the semiconductor elements and the spacer. The above-mentioned simplification of the producing process makes it possible to make the producing-efficiency of plural semiconductor elements or the like which are three-dimensional mounted even higher.

BRIEF DESCRIPTION OF THE DRAWINGS

FIG. 1 is process chart illustrating a process for producing a semiconductor device according to a first embodiment of the present invention;

FIG. 2 is process chart illustrating a process for producing a semiconductor device according to a second embodiment of the present invention;

FIG. 3 is process chart illustrating a process for producing a semiconductor device according to a third embodiment of the present invention;

FIG. 4 is process chart illustrating a process for producing a semiconductor device according to a forth embodiment of the present invention;

FIG. 5 is process chart illustrating a process for producing a semiconductor device according to a fifth embodiment of the present invention;

FIG. 6 is process chart illustrating a process for producing a semiconductor device according to a sixth embodiment of the present invention;

FIG. 7 is a sectional view schematically illustrating a semiconductor device obtained by the process for producing the semiconductor device according to the sixth embodiment of the present invention; and FIG. 8 is process chart illustrating a process for producing a semiconductor device according to a seventh embodiment of the present invention.

BEST MODE FOR CARRYING OUT THE INVENTION

First Embodiment

An embodiment of the present invention is described with reference to FIGS. 1(a) to 1(c), which are process charts for explaining a process for producing a semiconductor device according to the present embodiment. In the Figures, however, parts or portions unnecessary for the explanation are omitted and some parts or portions are enlarged, scaled down or modified to make the explanation easily. The same matter is applied to the other drawings.

The semiconductor device producing process according to the present embodiment comprises a pre-setting step of pre-setting a semiconductor element 13 through an adhesive sheet 12 onto a substrate or lead frame (an object onto which the semiconductor element is to be set) 11, which will referred to merely as the "substrate 11 or the like" hereinafter, and a wire bonding step of performing wire bonding without heating step. This process further comprises a sealing step of sealing the semiconductor element 13 with a sealing resin 15, and a post-curing step of post-curing the sealing resin 15.

As illustrated in FIG. 1(a), the pre-setting step is a step of pre-setting the semiconductor element 13 through the adhesive sheet 12 onto the substrate 11 or the like. The method for pre-setting the semiconductor substrate 13 onto the substrate 11 or the like may be, for example, a method of laminating the adhesive sheet 12 onto the substrate 11 or the like and subsequently laminating and pre-setting the semiconductor element 13 on the adhesive sheet 12 in such a manner that the wire bonding face of the semiconductor element 13 is directed upwards. The semiconductor element 13 on which the adhesive sheet 12 is beforehand pre-set may be pre-set onto the substrate 11 or the like.

The substrate may be any substrate known in the prior art. The lead frame may be a metal lead frame such as a Cu lead frame or a 42-alloy lead frame; or an organic substrate made of glass epoxy resin, BT (bismaleimide-triazine), polyimide or the like. In the present invention, however, the substrate is not limited to these substrates, and may be a circuit substrate that can be used in the state that a semiconductor element is mounted on the substrate itself and is electrically connected thereto.

As the adhesive sheet 12, a sheet having a storage elastic modulus of 1 MPa or more in the temperature range of 80 to 250° C. or a storage elastic modulus of 1 MPa or more, more preferably of 1 to 100 Mpa, at any temperature in the temperature range before curing the sheet is used. When the storage elastic modulus of the adhesive sheet 12 is 1 MPa or more, even if the wire bonding step is performed without performing any heating step, shear deformation is not generated in the adhesion face between the adhesive sheet 12 and the semiconductor element 13 or the substrate 11 or the like by ultrasonic vibration or heating in the step. In other words, the semiconductor element is not shifted by ultrasonic vibration in the wire bonding step, thereby preventing a fall in the success ratio of the wire bonding. Thus, the yield can be improved. The adhesive sheet 12 will be described in more detail later.

The wire bonding step is a step of electrically connecting the tips of terminal portions (inner leads) of the substrate 11 or the like to electrode pads (not illustrated) on the semiconductor element 13 through bonding wires 16 (see FIG. 1(b)). The present step is carried out without any adhesion through the adhesive sheet 12. In the step, the semiconductor element 13 and the substrate 11 or the like are not fixed each other through the adhesive sheet 12. As the bonding wires 14, for example, gold wires, aluminum wires or copper wires are used. When the wire bonding is performed, the bonding temperature is indispensably from 80 to 250° C., preferably from 80 to 220° C. If the temperature is lower than 80° C., there arises an inconvenience that the strength of the bonded wires becomes weak. On the other hand, if the temperature is higher than 250° C., the substrate is warped to result in an inconvenience that the wire bonding cannot be performed with stability. The heating time is from several seconds to several minutes.

The wire connection is performed by using vibration energy based on ultrasonic waves and compression energy based on the application pressure in the state that the wires are heated into the above-mentioned temperature range. Examples of such a manner include an ultrasonic manner and an ultrasonic thermal compression manner. The latter manner or other similar manners are ordinarily performed in the joint temperature range of 300 to 350° C. Thus, these manners are preferred in the present invention.

The above-mentioned sealing step is a step of sealing the semiconductor element 13 with a sealing resin 15 (see FIG. 1(c)), and is performed to protect the semiconductor element 13 and the bonding wires 16 mounted on the substrate 11 or the like. The present step is performed by molding the sealing resin with a mold or die. The sealing resin 15 may be, for example, an epoxy resin. The heating for the resin-sealing is performed usually at 175° C. for 60 to 90 seconds. In the this invention, however, the heating is not limited to this, and may be performed, for example at 165 to 185° C. for several minutes. In such a way, the sealing resin is cured and further the semiconductor element 13 and the substrate 11 or the like are set to each other through the adhesive sheet 12. In short, even if the post-curing step, which will be detailed later, is not performed in this invention, the sticking/fixing based on the adhesive sheet 12 can be attained in the present step so that the number of the producing steps can be reduced and the term for producing the semiconductor device can be shortened.

In the post-curing step, the sealing resin 15, which is not sufficiently cured in the sealing step, is completely cured. Even if the semiconductor element 13 and the substrate 11 or the like are not set to each other through the adhesive sheet 12 in the sealing step, the sealing resin 15 is cured and further they are set through the adhesive sheet 12 in the present step. The heating temperature in the present step is varied dependently on the kind of the sealing resin, and is, for example, in the range of 165 to 185° C. The heating time is from about 0.5 to 8 hours.

The following will describe the adhesive sheet 12 in detail. The configuration of the adhesive sheet 12 is not particularly limited as long as the sheet has a storage elastic modulus of 1 MPa or more in the temperature range of 80 to 250° C. or a storage elastic modulus of 1 MPa or more at any temperature in the temperature range before curing the sheet. Since the storage elastic modulus is set into the above-mentioned numerical range in the embodiment, it is sufficient that a necessary material is appropriately selected from, for example, materials which will be described later and then the adhesive sheet 12 is formed under predetermined conditions. The storage elastic modulus of the adhesive sheet 12 can be made low by increasing, for example, the amount of the thermoplastic resin in the sheet. The storage elastic modulus can be made high by increasing the amount of the thermosetting resin therein.

The following describes the adhesive sheet 12 in detail. The adhesive sheet 12 may have any structure that can give a shear adhesive force of 0.2 MPa or more at the time of the wire bonding. Specific examples thereof include an adhesive sheet made only of a single adhesive layer, and a multi-layered adhesive sheet wherein an adhesive layer or adhesive layers is/are formed on a single face or both faces of a core member. Examples of the core member include films (such as polyimide, polyester, polyethylene terephthalate, polyethylene naphthalate, and polycarbonate films); resin substrates which are reinforced with glass fiber or plastic nonwoven finer; silicon substrates; and glass substrates. The core member may be a member wherein an adhesive sheet is integrated with a dicing sheet.

The adhesive layer is a layer having an adhesive function, and the constituent material thereof may be a material composed of a thermoplastic resin and a thermosetting resin, or a material made only of a thermoplastic resin.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth) acrylate, and (meth) acryloyloxynaphthalenesulfonic acid; and monomers which contain a phosphoric acid group, such as 2-hydroxyethylacryloyl phosphate.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

In the present invention, an adhesive sheet comprising the epoxy resin, the phenol resin, and an acrylic resin is particularly preferable. Since these resins contain ionic impurities in only a small amount and have high heat resistance, the reliability of the semiconductor element can be ensured. About the blend ratio in this case, the amount of the mixture of the epoxy resin and the phenol resin is from 10 to 200 parts by weight for 100 parts by weight of the acrylic resin component.

In order to crosslink the adhesive sheet 12 of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

An inorganic filler may be appropriately incorporated into the adhesive sheet 12 of the present invention in accordance with the use purpose thereof. The incorporation of the inorganic filler makes it possible to confer electric conductance to the sheet, improve the thermal conductivity thereof, and adjust the elasticity. Examples of the inorganic fillers include various inorganic powders made of the following: a ceramic such as silica, clay, plaster, calcium carbonate, barium sulfate, aluminum oxide, beryllium oxide, silicon carbide or silicon nitride; a metal such as aluminum, copper, silver, gold, nickel, chromium, lead, tin, zinc, palladium or solder, or an alloy thereof; and carbon. These may be used alone or in combination of two or more thereof. Among these, silica, in particular fused silica is preferably used. The average particle size of the inorganic filler is preferably from 0.1 to 80 μm.

The amount of the inorganic filler to be incorporated is preferably set into the range of 0 to 80% by weight (more preferably, 0 to 70% by weight) for 100 parts by weight of the organic resin components.

If necessary, other additives besides the inorganic filler may be incorporated into the adhesive sheet 12 of the present invention. Examples thereof include a flame retardant, a silane coupling agent, and an ion trapping agent.

Examples of the flame retardant include antimony trioxide, antimony pentaoxide, and brominated epoxy resin. These may be used alone or in combination of two or more thereof.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof.

Examples of the ion trapping agent include hydrotalcite and bismuth hydroxide. These may be used alone or in combination of two or more thereof.

Embodiment 2

A process for producing a semiconductor device according to embodiment 2 is described with reference to FIGS. 2(a) to 2(e), which are process charts for explaining this process.

The semiconductor device according to the present embodiment is different from the semiconductor device according to the above-mentioned embodiment 1 in that plural semiconductor elements are laminated to be three-dimensionally mounted. More specifically, the present embodiment comprises the step of laminating, on a semiconductor element, another semiconductor element through the adhesive sheet as described above, which is different from the embodiment 1.

First, as illustrated in FIG. 2(a), at least one adhesive sheet 12, which is cut into a given size, is pre-set onto a substrate 11 or the like, which is an object on which the sheet 12 is to be set. Next, a semiconductor element 13 is pre-set onto the adhesive sheet 12 so that the wire bonding face thereof is directed upwards (see FIG. 2(b)). Furthermore, an adhesive sheet 14 is pre-set onto the semiconductor element 13 to avoid electrode pad portions of the element 13 (see FIG. 2(c)). Another semiconductor element 13 is then formed on the adhesive sheet 14 so that the wire bonding face thereof is directed upwards (see FIG. 2(d)).

Next, as illustrated in FIG. 2(e), a wire bonding step is carried out without performing any heating step, thereby electrically connecting electrode pads of the semiconductor elements 13 to the substrate 11 or the like through bonding wires 16.

Next, a sealing step of sealing the semiconductor elements 13 with a sealing resin is performed to cure the sealing resin and further to stick/fix the substrate 11 or the like onto one of the semiconductors 13 and stick/fix the semiconductor elements 13 each other through the adhesive sheets 12 and 14. After the sealing step, a post-curing step may be performed.

According to the present embodiment, about the three-dimensional mounting of the semiconductor elements, the production steps thereof can be made simple and the yield thereof can be improved as well, since no heating step based on the heating of the adhesive sheets 12 and 14 is performed. The semiconductor elements can be made even thinner, since the substrate 11 or the like is not warped and the semiconductor elements 13 are not cracked.

Embodiment 3

A process for producing a semiconductor device according to embodiment 3 is described with reference to FIGS. 3(a) to 3(g), which are process charts for explaining this process.

The semiconductor device according to the present embodiment is different from the semiconductor device related to the embodiment 2 in that a spacer is inserted between laminated semiconductor elements. More specifically, the present embodiment comprises the step of inserting a spacer between semiconductor elements in such a manner that an adhesive sheet is interposed between the spacer and each of the semiconductor elements, which is different from the embodiment 2.

First, as illustrated in FIGS. 3(a) to 3(c), an adhesive sheet 12, a semiconductor element 13 and an adhesive sheet 14 are successively laminated and pre-set onto a substrate 11 or the like in the same way as in the embodiment 2. Furthermore, on the adhesive sheet 14, a spacer 21, another adhesive sheet 14 and another semiconductor element 13 are successively laminated and pre-set (see FIGS. 3(d) to 3(f)).

Next, as illustrated in FIG. 3(g), a wire bonding step is carried out without performing any heating step, thereby electrically connecting electrode pads of the semiconductor elements 13 to the substrate 11 or the like through bonding wires 16.

Next, a sealing step of sealing the semiconductor elements with a sealing resin is performed to cure the sealing resin and further stick/fix the substrate 11 or the like onto one of the semiconductors element 13 and stick/fix the other semiconductor element 13 onto the spacer 21 through the adhesive sheets 12 and 14. After the sealing step, a post-curing step may be performed. The above-mentioned producing process makes it possible to yield a semiconductor device according to the present embodiment.

The spacer is not limited to any especial kind, and may be a spacer known in the prior art, such a silicon chip or a polyimide film.

Embodiment 4

A process for producing a semiconductor device according to embodiment 4 is described with reference to FIGS. 4(a) to 4(e), which are process charts for explaining this process.

First, as illustrated in FIG. 4(a), an adhesive sheet 12' is stuck onto the rear face of a semiconductor wafer 13' to form a semiconductor wafer with the adhesive sheet. Next, a dicing tape 33 is pre-set onto the semiconductor wafer 13' (see FIG. 4(b)). The semiconductor wafer with the adhesive sheet is then diced into chips each having a given size (see FIG. 4(c)). The chips with the adhesive are peeled from the dicing tape 33.

Next, as illustrated in FIG. 4(d), one 13 of the semiconductor elements with an adhesive sheet 12 is pre-set onto a substrate 11 or the like in such a manner that the wire bonding face thereof is directed upwards. A semiconductor element 32, which has a different size from that of the semiconductor element 13 and has an attached adhesive sheet 31, is pre-set onto the semiconductor element 13 in such a manner that the wire bonding face thereof is directed upwards.

Next, as illustrated in FIG. 4(e), a wire bonding step is carried out without performing any heating step, thereby electrically connecting electrode pads of the semiconductor elements 13 and 32 to the substrate 11 or the like through bonding wires 16.

Next, a sealing step of sealing the semiconductor elements with a sealing resin is performed to cure the sealing resin and further to stick/fix the substrate 11 or the like onto the semiconductor 13 and stick/fix the semiconductor element 13 onto the semiconductor element 32 through the adhesive sheet pieces 12 and 31. After the sealing step, a post-curing step may be performed. The above-mentioned producing process makes it possible to yield a semiconductor device according to the present embodiment.

Embodiment 5

A process for producing a semiconductor device according to Embodiment 5 is described with reference to FIGS. 5(a) to 5(e), which are process charts for explaining this process.

The semiconductor device producing process according to the present embodiment is different from the semiconductor device producing process according to the embodiment 4 in that an adhesive sheet 12' is laminated onto a dicing tape 33 and subsequently a semiconductor wafer 13' is laminated onto the adhesive sheet 12'.

First, as illustrated in FIG. 5(a), an adhesive sheet 12' is laminated onto a dicing tape 33. A semiconductor wafer 13' is then laminated onto the adhesive sheet 12' (see FIG. 5(b)). The semiconductor wafer with the adhesive sheet is then diced into chips each having a given size (see FIG. 5c)). The chips with the adhesive are peeled from the dicing tape 33.

Next, as illustrated in FIG. 5(d), one 13 of the semiconductor elements with an adhesive sheet piece 12 is pre-set onto a substrate 11 or the like in such a manner that the wire bonding face thereof is directed upwards. A semiconductor element 32, which has a different size from that of the semiconductor element 13 and has an attached adhesive sheet 31, is pre-set onto the semiconductor element 13 in such a manner that the wire bonding face thereof is directed upwards. At this time, the sticking/fixing of the semiconductor element 32 is performed to avoid electrode pad portions of the subjacent semiconductor element 13.

Next, as illustrated in FIG. 5(e), a wire bonding step is carried out without performing any heating step, thereby electrically connecting electrode pads of the semiconductor elements 13 and 32 to lands for internal connection in the substrate 11 or the like through bonding wires 16.

Next, a sealing step of sealing the semiconductor elements with a sealing resin is performed to cure the sealing resin and further to stick/fix the substrate 11 or the like onto the semiconductor element 13 and stick/fix the semiconductor element 13 onto the semiconductor element 32 through the adhesive sheet pieces 12 and 31. After the sealing step, a post-curing step may be performed. The above-mentioned producing process makes it possible to yield a semiconductor device according to the present embodiment.

Embodiment 6

A process for producing a semiconductor device according to Embodiment 6 is described with reference to FIGS. 6(a) to 6(c) and FIG. 7. FIGS. 6(a) to 6(c) are process charts for explaining this process. FIG. 7 is a sectional view, which schematically illustrates a semiconductor device obtained by the semiconductor device producing process according to the present embodiment.

The semiconductor device according to the present embodiment is different from the semiconductor device according to the embodiment 3 in that a core member is used as a spacer.

First, an adhesive sheet 12' is laminated onto a dicing tape 33 in the same way as in the embodiment 5. A semiconductor wafer 13' is then laminated onto the adhesive sheet 12'. The semiconductor wafer with the adhesive sheet is then diced into chips each having a given size. The chips with the adhesive are peeled from the dicing tape 33, thereby yielding semiconductor elements 13 to each of which an adhesive sheet piece 12 is attached.

Separately, an adhesive sheet 41 is formed on a dicing tape 33, and then a core member 42 is attached onto the adhesive sheet 41. The resultant is then diced into chips each having a given size. The chips with the adhesive are peeled from the dicing tape 33, thereby yielding core member pieces 42' which are each in a chip form and each have an attached adhesive sheet piece 41'.

Next, one of the semiconductor elements 13 is pre-set onto a substrate 11 or the like through the adhesive sheet 12 in such a manner that the wire bonding face thereof is directed upwards. Furthermore, one of the core member 42' is pre-set onto the semiconductor element 13 through the adhesive sheet 41'. Another element out of the semiconductor elements 13 is pre-set onto the core member 42' through the adhesive sheet 12 in such a manner that the wire bonding face thereof is directed upwards. The above-mentioned producing process makes it possible to yield a semiconductor device according to the present embodiment.

Next, a wire bonding step is carried out without performing any heating step, thereby electrically connecting electrode pads of the semiconductor elements 13 to lands for internal connection in the substrate 11 or the like through bonding wires 16 (see FIG. 7).

Next, a sealing step of sealing the semiconductor elements with a sealing resin is performed to cure the sealing resin and further to stick/fix the substrate 11 or the like onto one of the semiconductors element 13 and stick/fix the other semiconductor element 13 onto the core member piece 42' through the adhesive sheet 12 and 41'. After the sealing step, a post-curing step may be performed. The above-mentioned producing process makes it possible to yield a semiconductor device according to the present embodiment.

The core member is not limited to any especial kind, and may be a core member known in the prior art. Specific examples of the core member include films (such as polyimide film, polyester film, polyethylene terephthalate film, polyethylene naphthalate film, and polycarbonate film); resin substrates which are reinforced with glass fiber or plastic nonwoven finer; mirror silicon wafers; silicon substrates; and glass substrates.

Embodiment 7

A process for producing a semiconductor device according to Embodiment 7 is described with reference to FIGS. 8(a) and 8(b), which are process charts for explaining this process.

The semiconductor device producing process according to the present embodiment is different from the semiconductor device producing process according to the embodiment 6 in that a core member is made into chips by punching or some other method instead of dicing.

First, semiconductor elements 13 each provided with an adhesive sheet 12 are yielded in the same way as in the embodiment 6. Separately, a core member 42 is attached onto an adhesive sheet 41. The resultant is made into chips each having a given size by punching or some other method. In this way, cores member 42' each of which is in a chip form and provided with an adhesive sheet 41' are yielded.

Next, one of the core member pieces 42' and one of the semiconductor elements 13 are successively laminated on another element out of the semiconductor elements 13 through the adhesive sheet pieces 12 and 41' and then are pre-set in the same way as that of Embodiment 6.

Furthermore, the resultant is subjected to a wire bonding step, a sealing step and an optional post-curing step, so as to yield a semiconductor device according to the present embodiment.

(Other Matters)

The above-mentioned description is about the most preferable embodiments of the invention. However, the invention is not limited to the Embodiments, and can be variously changed or modified within substantially the same scope of the technical conception as recited in the claims of the invention.

When semiconductor elements are three-dimensional mounted onto any one of the above-mentioned substrates, a buffer coat layer may be formed on the substrate surface on which circuits of the semiconductor elements are formed. The buffer coat layer may be, for example, a silicon nitride film, or a layer made of a heat-resistant resin such as polyimide resin.

The compositions of the adhesive sheets used in the respective stages at the time of the three-dimensional mounting of the semiconductor elements may be the same, but not limited thereto, and may be appropriately varied dependently on the producing conditions or use purposes thereof, or the like.

The laminating method of each of the above-mentioned embodiments is a mere example, and may be appropriately changed if necessary. For example, in the semiconductor device producing process according to the embodiment 2, the semiconductor elements in the second stage and higher stages may be laminated by the laminating method described about the embodiment 3.

About the above-mentioned embodiments, there are described embodiments wherein semiconductor elements are laminated on a substrate or the like and subsequently all the elements are subjected to a wire bonding step at a time. However, the present invention is not limited to the embodiments. For example, a wire bonding step may be performed every time when semiconductor elements are laminated on or over a substrate or the like.

EXAMPLES

Preferred examples of this invention will be illustratively described in detail hereinafter. However, materials, blend amounts and others that will be described in the Examples do not limit to this invention unless any restrictive description is particularly included. Thus, these are mere explanatory examples. In the examples, the word "part(s)" and the symbol "%" represent "part(s) by weight" and "% by weight", respectively, unless otherwise specified.

Example 1

Into methyl ethyl ketone were dissolved 100 parts of an acrylic ester type polymer made mainly of ethyl acrylate and methyl methacrylate (PARACRON W-197CM, manufactured by Negami Chemical Industrial Co., Ltd.), 3 parts of a polyfunctional isocyanate type crosslinking agent, 23 parts of an epoxy resin (Epikote 1004, manufactured by Japan Epoxy Resin Co., Ltd.), and 6 parts of a phenol resin (MilexXLC-CC, manufactured by Mitsui Chemicals, Inc. Chemicals, Inc.), so as to prepare an adhesive composition solution having a concentration of 20% by weight.

This adhesive composition solution was applied onto a release-treated film made of a polyethylene terephthalate film (thickness: 50 μm) treated for release with silicone as a releasing liner. The resultant was then dried at 120° C. for 3 minutes to form an adhesive sheet having a 25 μm of thickness according to Example 1.

Example 2

An adhesive sheet (thickness: 25 μm) according to Example 2 was formed in the same way as in Example 1 except that a polymer made mainly of butyl acrylate (PARACRON SN-710, manufactured by Negami Chemical Industrial Co., Ltd.) was used instead of the acrylic ester type polymer used in Example 1.

Comparative Example 1

Into methyl ethyl ketone were dissolved 100 parts of the acrylic ester type polymer made mainly of ethyl acrylate and methyl methacrylate (PARACRON W-197CM, manufactured by Negami Chemical Industrial Co., Ltd.), 23 parts of the epoxy resin (Epikote 1004, manufactured by Japan Epoxy Resin Co., Ltd.), and 6 parts of the phenol resin (Milex XLC-CC, manufactured by Mitsui Chemicals, Inc.), so as to prepare an adhesive composition solution having a concentration of 20% by weight.

This adhesive composition solution was applied onto a release-treated film made of a polyethylene terephthalate film (thickness: 50 μm) treated for release with silicone as a releasing liner. The resultant was then dried at 120° C. for 3 minutes to form an adhesive sheet having a 25 μm of thickness according to Comparative Example 1.

Comparative Example 2

An adhesive sheet (thickness: 25 μm) according to Comparative Example 2 was formed in the same way as in Comparative Example 1 except that the polymer made mainly of butyl acrylate (PARACRON SN-710, manufactured by Negami Chemical Industrial Co., Ltd.) was used instead of the acrylic ester type polymer used in Comparative Example 1.

[Storage Elastic Modulus Measurement]

About each of the adhesive sheets produced in Examples and Comparative Examples described above, the storage elastic modulus before curing the sheet was measured as follows.

The device used in the measurement was a dynamic viscoelasticity measuring device (RSAn, manufactured by Reometric Scientific). In the measurement, the sheet was cut into a piece 10 mm in length and 5 mm in width, and the resultant sample was measured in the temperature range of 30 to 280° C. at a constant frequency of 10 Hz in a tensile mode while the temperature was raised at 10° C./minute. Thus, the storage elastic modulus was decided in the range of 80 to 250° C.

These results are shown in Table 1 described below.

TABLE 1

| | Storage elastic modulus (MPa) Hot plate temperature (° C.) | | | | | | | |
|---|---|---|---|---|---|---|---|---|
| | 80 | 100 | 125 | 150 | 175 | 200 | 225 | 250 |
| Example 1 | 2.6 | 1.8 | 1.9 | 1.9 | 1.8 | 1.7 | 1.8 | 2.9 |
| Example 2 | 2.4 | 1.6 | 1.7 | 1.6 | 1.6 | 1.7 | 1.7 | 2.0 |
| Comparative Example 1 | 0.1 | — | — | — | — | — | — | — |
| Comparative Example 2 | 0.2 | — | — | — | — | — | — | — |

As shown in Table 1, the adhesive sheets according to Examples 1 and 2 each exhibited a storage elastic modulus of 1.0 MPa or more at each of hot plate temperatures. On the other hand, the shear adhesive force of each of the adhesive sheets according to Comparative Examples 1 and 2 was 0.2 MPa or less. In Comparative Examples 1 and 2, each storage elastic modulus in the range of 100 to 250° C. was smaller than the limit of the measurement (0.1 MPa).

[Wire Bondability]

The adhesive sheets of Examples and Comparative Example were each used to evaluate the wire bondability thereof in the case of using a semiconductor element and each of a lead frame, a substrate and a semiconductor element.

First, a sample of each of the substrate, the lead frame, and the semiconductor was formed as follows.

As the substrate, a substrate having a trade name of FTBGA 16×16 (2216-001A01) (manufactured by UniMicron Technology Corp.) was used. In this case, there was used a product obtained by peeling each of the resultant adhesive sheets from the separator, and then cutting the sheet into a piece 6 mm square. Separately, an aluminum-evaporated wafer was diced to form a chip 6 mm in length, 6 mm in width and 100 μm in thickness. This chip was die-attached to the substrate to produce a test piece. The die-attachment was performed by using a die bonder (SPA-300, manufactured by Shinkawa Ltd.) under a condition that a load of 0.25 MPa was applied to the chip at a temperature of 120° C. and the chip was heated for 1 second.

As the lead frame, a lead frame having an article name of CA-F313 (MF202) (manufactured by Shinko Electric Co., Ltd.) was used. In this case, there was used a product obtained by peeling each of the adhesive sheets from the separator, and then cutting the sheet into a piece 7.5 mm square. Separately, an aluminum-evaporated wafer was diced to form a chip 7.5 mm in length, 7.5 mm in width and 100 μm in thickness. This chip was die-attached to the substrate to produce a test piece. The die-attachment was performed under the same condition as in the case of the substrate.

In the case of the semiconductor, there was used a product obtained by peeling each of the resultant adhesive sheets from the separator, and then cutting the sheet into a piece 6 mm square. A product obtained by dicing an element for evaluation (model number: NT-103, manufactured by Phenix Semiconductor Kabushiki Kaisha [transliteration], passivation layer: $Si_3N_4$ (thickness: 5000 Å)), wherein a model pattern for evaluation was made into a piece 6 mm in length, 6 mm in width, and 100 μm in thickness, was die-attached to a die pad of a lead frame having an article name of CA-F313 (MF202) (manufactured by Shinko Electric Co., Ltd.). This element for evaluation was used as a first semiconductor element. Next, the above-mentioned adhesive sheet was cut into a piece 5 mm square, and this was used. A chip obtained by dicing an aluminum-evaporated wafer into a piece 5 mm in length, 5 mm in width and 100 μm in thickness was die-attached to the above-mentioned element for evaluation to form a test piece. This was used as a second semiconductor element. About each of the substrate, the lead frame, and the semiconductor element, 20 samples were formed in total.

Next, gold wires (diameter: 25 μm) for wire bonding were bonded to predetermined positions about each of the samples in an ultrasonic thermal compression manner. The number of the wire bonds was 80 per sample. Conditions for the wire bonding are as follows: the time for outputting the ultrasonic waves was 10 ms; the power of the ultrasonic waves was 120; the bond load was 980 mN; and the stage temperature was set to 80, 175 and 250° C. The wire bonding device used was a UTC-300 (manufactured by Shinkawa Ltd.). About the evaluation of the wire bonding success ratio, pull strength evaluation was made by means of a tension gauge. A case where the pull strength was 5 g or more was judged as successful. For reference, each of the samples was not subjected to any heating treatment after the die-attachment. In the case of each of the semiconductor element samples, the wire bonding was performed between the second semiconductor element and the lead frame.

These results are shown in Table 2 described below.

TABLE 2

| | Success ratio (%) of wire bonding without any heating step (%) | | | | | | | | |
|---|---|---|---|---|---|---|---|---|---|
| | Lead frame | | | Substrate | | | Semiconductor element | | |
| | | | | Wire bonding temperature (° C.) | | | | | |
| | 80 | 175 | 250 | 80 | 175 | 250 | 80 | 175 | 250 |
| Example 1 | 100 | 100 | 100 | 100 | 100 | 100 | 100 | 100 | 100 |
| Example 2 | 100 | 100 | 100 | 100 | 100 | 100 | 100 | 100 | 100 |
| Comparative Example 1 | 0 | 0 | 0 | 0 | 0 | 0 | 0 | 0 | 0 |
| Comparative Example 2 | 0 | 0 | 0 | 0 | 0 | 0 | 0 | 0 | 0 |

As shown in Table 2, about the adhesive sheets according to Examples 1 and 2, the success ratio was 100% at all of the hot plate temperatures. On the other hand, about the adhesive sheets according to Comparative Examples 1 and 2, the success ratio was 0%. The reason why the success ratio was 100% about the adhesive sheets according to Examples 1 and 2 is that no chip-shift was generated since the sheets each had a sufficient storage elastic modulus.

The invention claimed is:

1. A process for producing a semiconductor device, comprising:
 a pre-setting step comprising pre-setting a semiconductor element through an adhesive sheet to an object to which the semiconductor element is to be set,
 a wire bonding step comprising wire bonding the semiconductor element in the bonding temperature range of 80 to 250° C.,
 a sealing step comprising sealing the semiconductor element with a sealing resin, and
 a post-curing step comprising subjecting the sealing resin to post-curing,
 wherein, the adhesive sheet, before curing, has a storage elastic modulus of 1 MPa or more at any temperature in the temperature range of 80 to 250° C., and
 wherein, during the wire bonding step, the adhesive sheet is not cured by heating, and
 wherein, in the sealing step, the post-curing step, or a combination thereof, the sealing resin is cured by heating, and further the semiconductor element and the adherend are securely fastened to adhere each other through the adhesive sheet, and
 wherein, during the wire-bonding step, the semiconductor element and the object to which the semiconductor element is to be set are not securely fastened to each other through the adhesive sheet.

2. The process for producing a semiconductor device according to claim 1, wherein the adherend is a substrate, a lead frame or a semiconductor element.

3. The process for producing a semiconductor device according to claim 1, wherein as the adhesive sheet, a sheet including a thermoplastic resin is used.

4. The process for producing a semiconductor device according to claim 1, wherein as the adhesive sheet, a sheet including both a thermosetting resin and a thermoplastic resin is used.

5. The process for producing a semiconductor device according to claim 3, wherein as the thermoplastic resin, an acrylic resin is used.

6. The process for producing a semiconductor device according to claim 4, wherein the thermosetting resin comprises an epoxy resin, a phenol resin, or a combination thereof.

7. The process for producing a semiconductor device according to claim 3, wherein as the adhesive sheet, a sheet to which a crosslinking agent is added is used.

8. A semiconductor device, obtained by the process for producing semiconductor device according to claim 1.

9. A process for producing a semiconductor device, comprising:
 pre-setting a semiconductor element through an adhesive sheet to an object to which the semiconductor element is to be set, and
 wire bonding the semiconductor element in the bonding temperature range of 80 to 250° C., wherein the semiconductor element and the object to which the semiconductor element is to be set are not securely fastened to each other through the adhesive sheet,
 wherein during wire bonding, the adhesive sheet is not cured by heating, and
 wherein the adhesive sheet has a storage elastic modulus of 1 MPa or more in the temperature range of 80 to 250° C. or a storage elastic modulus of 1 MPa or more at any temperature in the temperature range before curing the sheet.

10. The process of claim 1, wherein the adhesive sheet comprises between about 33% and about 91% by weight of an acrylic resin consisting of monomers selected from the group consisting of $C_{1-30}$ alkyl acrylate, $C_{1-30}$ alkyl methacrylate, acrylic acid, methacrylic acid, carboxyethyl acrylate, carboxypentyl acrylate, itaconic acid, maleic acid, fumaric acid, and crotonic acid, maleic anhydride, itaconic anhydride, 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, (4-hydroxymethylcyclohexyl)methylacrylate, styrenesulfonic acid, allylsulfonic acid, 2-(meth)acrylamide-2-methylpropanesulfonic acid, (meth)acrylamidepropane sulfonic acid, sulfopropyl (meth)acrylate, (meth)acryloyloxynaphthalenesulfonic acid, and 2-hydroxyethylacryloyl phosphate.

11. The process of claim 3, wherein the adhesive sheet comprises between about 33% to about 91% by weight of a thermoplastic resin.

12. The process of claim 1, wherein the adhesive sheet is not cured prior to or at the time of wire bonding.

13. The process of claim 9, wherein the adhesive sheet, before curing, has a storage elastic modulus of 1 MPa more at any temperature in the temperature range.

14. The process of claim 1, wherein, during the wire bonding step, the adhesive sheet has a storage elastic modulus of 1 MPa or more at any temperature in the temperature range of 80 to 250° C.

* * * * *

UNITED STATES PATENT AND TRADEMARK OFFICE
CERTIFICATE OF CORRECTION

| | | |
|---|---|---|
| PATENT NO. | : 8,236,614 B2 | Page 1 of 1 |
| APPLICATION NO. | : 11/816696 | |
| DATED | : August 7, 2012 | |
| INVENTOR(S) | : Sadahito Misumi et al. | |

It is certified that error appears in the above-identified patent and that said Letters Patent is hereby corrected as shown below:

At Page 2, Column 2, (Item 56), Line 9, under U.S. Patent Documents, please change ".orq/" to --.org/--.

In the Specifications:

At Column 5, Line 37, please change "Mpa," to --MPa,--.

At Column 6, Line 17, please change "the this" to --this--.

At Column 7, Line 44, please change "(meth) acrylate," to --(meth)acrylate,--.

At Column 7, Line 65, please change "tris-glycicylisocyanurate" to --tri-glycidylisocyanurate--.

At Column 9, Line 13, (Approx.), please change "pentaoxide," to --pentoxide,--.

At Column 14, Line 3-5, please change "(MilexXLC-CC, manufactured by Mitsui Chemicals, Inc. Chemicals, Inc.)," to --(Milex XLC-CC, manufactured by Mitsui Chemicals, Inc.),--.

At Column 14, Line 61-62, please change "Reometric" to --Rheometric--.

At Column 16, Line 9, (Approx.), please change "Phenix" to --Phoenix--.

In the Claims:

At Column 17, Line 26, in Claim 1, please change "wire-bonding" to --wire bonding--.

Signed and Sealed this
Eighth Day of January, 2013

David J. Kappos
*Director of the United States Patent and Trademark Office*